US011539017B2

(12) United States Patent
Yang et al.

(10) Patent No.: US 11,539,017 B2
(45) Date of Patent: Dec. 27, 2022

(54) DISPLAY SUBSTRATE HAVING SPACER FOR SPACING APART CARRIER INJECTION LAYER PORTIONS OF TWO ADJACENT SUB-PIXELS, AND MANUFACTURING METHOD THEREOF

(71) Applicant: BOE TECHNOLOGY GROUP CO., LTD, Beijing (CN)

(72) Inventors: Shengji Yang, Beijing (CN); Hui Wang, Beijing (CN); Xiaochuan Chen, Beijing (CN); Kuanta Huang, Beijing (CN); Yanming Wang, Beijing (CN); Pengcheng Lu, Beijing (CN); Yage Song, Beijing (CN); Guangtong Liu, Beijing (CN); Jiantong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 132 days.

(21) Appl. No.: 16/960,046

(22) PCT Filed: Aug. 23, 2019

(86) PCT No.: PCT/CN2019/102312
§ 371 (c)(1),
(2) Date: Jul. 3, 2020

(87) PCT Pub. No.: WO2021/035419
PCT Pub. Date: Mar. 4, 2021

(65) Prior Publication Data
US 2021/0408429 A1    Dec. 30, 2021

(51) Int. Cl.
*H01L 51/50* (2006.01)
*H01L 27/32* (2006.01)
*H01L 51/56* (2006.01)

(52) U.S. Cl.
CPC ........ *H01L 51/5088* (2013.01); *H01L 27/322* (2013.01); *H01L 27/3211* (2013.01); *H01L 51/56* (2013.01); *H01L 2251/558* (2013.01)

(58) Field of Classification Search
CPC ............. H01L 51/5088; H01L 27/3211; H01L 27/322; H01L 51/56
(Continued)

(56) References Cited

U.S. PATENT DOCUMENTS

| 9,773,447 B2 | 9/2017 | Yang et al. |
| 10,319,794 B2 | 6/2019 | Gao |

(Continued)

FOREIGN PATENT DOCUMENTS

| CN | 104617226 A | 5/2015 |
| CN | 106158914 A | 11/2016 |

(Continued)

OTHER PUBLICATIONS

Search report issued for European Application No. 19932229.8, dated Jul. 12, 2022, 12 pages.

*Primary Examiner* — Xia L Cross
(74) *Attorney, Agent, or Firm* — Dave Law Group LLC; Raj S. Dave

(57) ABSTRACT

A display substrate and a manufacturing method thereof are provided. The display substrate includes a base substrate, as well as a first conductive layer, an organic functional layer and a second conductive layer which are on the base substrate sequentially, and the organic functional layer includes a carrier injection layer including a first carrier injection layer portion and a second carrier injection layer portion which are in a first sub-pixel area and a second sub-pixel area respectively; the display substrate further includes a spacer which separates the first carrier injection layer portion and the second carrier injection layer portion, (Continued)

and the carrier injection layer further includes a third carrier injection layer portion which is separated from the first carrier injection layer portion and the second carrier injection layer portion respectively.

13 Claims, 10 Drawing Sheets

(58) Field of Classification Search
USPC ............................................................ 257/40
See application file for complete search history.

(56) References Cited

U.S. PATENT DOCUMENTS

| | | | |
|---|---|---|---|
| 2012/0208303 A1* | 8/2012 | Yamazaki | ............... H01L 51/56 |
| | | | 257/E33.061 |
| 2013/0087770 A1 | 4/2013 | Son et al. | |
| 2014/0103368 A1 | 4/2014 | Hatano et al. | |
| 2016/0365396 A1* | 12/2016 | Jiao | ......................... H01L 51/56 |
| 2019/0081116 A1* | 3/2019 | Kondo | ................ H01L 27/3218 |
| 2020/0028122 A1 | 1/2020 | Hu et al. | |
| 2021/0151714 A1 | 5/2021 | Microoled | |

FOREIGN PATENT DOCUMENTS

| | | |
|---|---|---|
| CN | 107425131 A | 12/2017 |
| CN | 107689385 A | 2/2018 |
| CN | 107978618 A | 5/2018 |
| WO | 2019033539 | 2/2019 |
| WO | 2019193290 | 10/2019 |

\* cited by examiner

DISPLAY SUBSTRATE HAVING SPACER FOR SPACING APART CARRIER INJECTION LAYER PORTIONS OF TWO ADJACENT SUB-PIXELS, AND MANUFACTURING METHOD THEREOF

CROSS-REFERENCE TO RELATED APPLICATIONS

This application is the National Stage Entry of PCT/CN2019/102312 filed on Aug. 23, 2019, the entire disclosure of which is incorporate herein by reference as part of the disclosure of this application.

TECHNICAL FIELD

Embodiments of the present disclosure relate to a display substrate and a manufacturing method thereof.

BACKGROUND

A micro organic light-emitting diode (OLED) display concerns a combination of an OLED technology and a CMOS technology, is relevant to interdisciplinary integration of photoelectronic industry and microelectronic industry, promotes a development of a new generation of micro display technology, and also promotes research and a development of organic electronics on silicon and even molecular electronics on silicon.

With excellent display characteristics, such as a high resolution, high luminance, rich colors, a low driving voltage, a high response speed, low power consumption, or the like, the micro OLED display has a broad development prospect.

SUMMARY

Embodiments of the present disclosure provide A display substrate, having a first sub-pixel area and a second sub-pixel area which are adjacent. The display substrate comprises a base substrate, and a first conductive layer, an organic functional layer and a second conductive layer which are on the base substrate sequentially. The organic functional layer comprises a carrier injection layer; the first conductive layer comprises a first electrode and a second electrode, and the first electrode and the second electrode are in the first sub-pixel area and the second sub-pixel area respectively, and are insulated from each other; the carrier injection layer comprises a first carrier injection layer portion and a second carrier injection layer portion, and the first carrier injection layer portion and the second carrier injection layer portion are in the first sub-pixel area and the second sub-pixel area respectively; the second conductive layer comprises a third electrode and a fourth electrode, the third electrode and the fourth electrode are in the first sub-pixel area and the second sub-pixel areas respectively, and the third electrode and the fourth electrode are connected with each other and are in an integrated structure; the first electrode, the first carrier injection layer portion and the third electrode form a first light-emitting element, and the second electrode, the second carrier injection layer portion and the fourth electrode form a second light-emitting element; the display substrate further comprises a spacer which is between the first and second light-emitting elements and separates the first carrier injection layer and the second carrier injection layer portion; the carrier injection layer further comprises a third carrier injection layer portion, and the third carrier injection layer portion is between the spacer and the second conductive layer, and is separated from the first carrier injection layer portion and the carrier injection layer respectively; and the display substrate further comprises a drive circuit which is electrically connected with the first light-emitting element and the second light-emitting element, and the drive circuit is configured to drive the first light-emitting element and the second light-emitting element; the drive circuit comprises a transistor comprising a semiconductor layer, and the semiconductor layer is inside the base substrate.

In some examples, the carrier injection layer is configured as an electron injection layer or a hole injection layer.

In some examples, the spacer has a recessed portion at a side surface adjacent to the first carrier injection layer portion and the second carrier injection layer portion.

In some examples, the spacer has a width reduced first and then increased in a direction away from the base substrate.

In some examples, the spacer has an inverted trapezoidal section in a direction perpendicular to the base substrate.

In some examples, the carrier injection layer further comprises a third carrier injection layer portion; and the carrier injection layer portion is located between the spacer and the second conductive layer and is separated from the first carrier injection layer portion and the second carrier injection layer portion respectively.

In some examples, a ratio of a thickness of the second conductive layer to a thickness of the spacer ranges from 0.5 to 2 in a direction perpendicular to the base substrate.

In some examples, the spacer comprises an antireflection coating layer comprising an antireflection organic material.

In some examples, the spacer is made of a negative photoresist material or an inorganic insulating material.

In some examples, the carrier injection layer further comprises the third carrier injection layer portion which, located between the spacer and the second conductive layer, is spaced away from the first carrier injection layer portion and the second carrier injection layer portion respectively.

In some examples, the organic functional layer further comprises a charge generation layer; the charge generation layer comprises a first charge generation layer portion and a second charge generation layer portion, and the first charge generation layer portion and the second charge generation layer portion are located in the first sub-pixel area and the second sub-pixel area respectively; and the spacer also spaces the first charge generation layer portion away from the second charge generation layer portion.

In some examples, the first light-emitting element and the second light-emitting element are configured to emit white light respectively.

In some examples, the organic functional layer comprises a plurality of light-emitting layers stacked in a direction perpendicular to the base substrate.

In some examples, at least two of the plurality of light-emitting layers are connected with each other in series, and the charge generation layer is located between two adjacent light-emitting layers of the at least two light-emitting layers.

In some examples, the plurality of light-emitting layers comprise a red-green light-emitting layer and a blue light-emitting layer which are connected with each other in series with a connection layer therebetween.

In some examples, the red-green light-emitting layer comprises a red light-emitting layer and a green light-emitting layer which are adjacent to each other, and the red light-emitting layer is closer to the first conductive layer.

In some examples, the display substrate further comprising a third light-emitting element in a third sub-pixel area, and the first light-emitting element, the second light-emitting element and the third light-emitting element form one pixel unit.

In some examples, the display substrate further comprising a color filter layer, and the color filter layer is located on a side of both the first light-emitting element and the second light-emitting element away from the base substrate.

Embodiments of the present disclosure further provide a manufacturing method of a display substrate having a first sub-pixel area and a second sub-pixel area which are adjacent to each other, comprising providing a base substrate, forming a drive circuit; and forming a first conductive layer, an organic functional layer and a second conductive layer on the base substrate in sequence. The first conductive layer comprises a first electrode and a second electrode which are in the first sub-pixel area and the second sub-pixel area respectively, the organic functional layer comprises a carrier injection layer comprising a first carrier injection layer portion and a second carrier injection layer portion which are located in the first sub-pixel area and the second sub-pixel area respectively, and the second conductive layer comprises a third electrode and a fourth electrode which are in the first sub-pixel area and the second sub-pixel area respectively; the first electrode, the first carrier injection layer portion and the third electrode form a first light-emitting element, and the second electrode, the second carrier injection layer portion and the fourth electrode form a second light-emitting element, and a spacer is formed between the first light-emitting element and the second light-emitting element. The drive circuit is electrically connected with and configured to drive the first light-emitting element and second light-emitting element; the drive circuit comprises a transistor comprising a semiconductor layer inside the base substrate; and the spacer separates the first carrier injection layer portion and the second carrier injection layer portion.

In some examples, the spacer is provided with a recessed portion at a side surface adjacent to the first carrier injection layer portion and the second carrier injection layer portion.

In some examples, forming the spacer between the first sub-pixel area and the second sub-pixel area comprises forming an antireflection material layer, forming a photoresist layer on the antireflection material layer; exposing the photoresist layer; and developing the exposed photoresist layer by a developing solution to obtain a photoresist pattern, and etching the antireflection material layer by the developing solution through the photoresist pattern, so as to form the spacer.

In some examples, the antireflection material layer is formed on the first electrode and the second electrode.

In some examples, the first conductive layer is formed on the photoresist pattern, and the photoresist pattern is subjected to a peeling-off process to form the first and second electrodes.

In some examples, the organic functional layer is formed on the spacer; and the carrier injection layer is divided at the spacer, thereby forming the first carrier injection layer portion and the second carrier injection layer portion.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
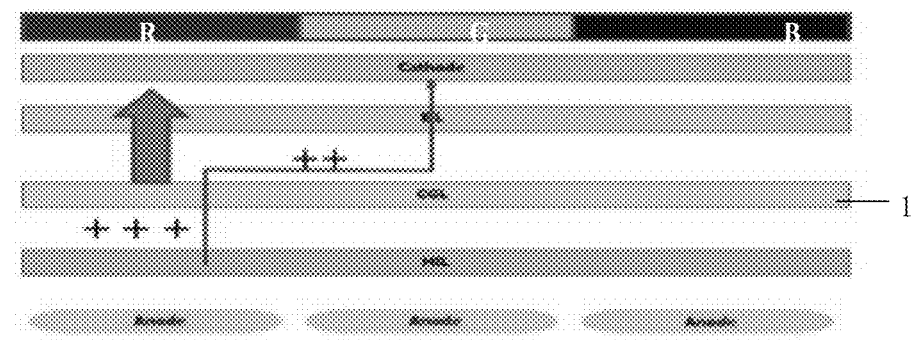
FIG. 1A is a schematic diagram of an electric leakage of an OLED display light-emitting device.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly. In order to make the following description of the embodiments of the present disclosure clear and concise, the present disclosure omits detailed descriptions of known functions and known components.

A micro organic light-emitting diode (OLED) display typically has a size less than 100 microns, for example, less than 50 microns, or the like, and concerns a combination of an OLED technology and a CMOS technology, and an OLED array is manufactured at a silicon-based substrate including a CMOS circuit.

Generally, an OLED device is formed by means of evaporating different organic functional layers (for example, electron/hole injection layers) with a fine metal mask (FMM). For example, the organic functional layer is patterned with the FFM to form corresponding patterns in different pixel areas. However, the FMM has limited accuracy and is unable to achieve a high image resolution (i.e., pixels per inch, PPI for short), which limits a resolution of the OLED device. Therefore, full-color display may be realized by a white light OLED in conjunction with a color filter layer. However, in such a technology, generally, the organic functional layer is formed as a continuous structure covering a plurality of sub-pixel regions, and an electric leakage tends to occur in a lateral direction, which causes a color cross-talk between sub-pixels and reduces a color gamut of the display device. For example, usually, organic functional sublayers, such as a carrier injection layer (for example, an electron injection layer (EIL) or a hole injection layer (HIL)), a light-emitting layer, a carrier injection layer (CGL), or the like, in the OLED device include metal elements, for example, including metal ions or being materials which contain metal elements and are doped heavily, and moving charges are generated under the action of a voltage, thereby causing the lateral electric leakage between the sub-pixels and then the color cross-talk problem.

Figure 1B:
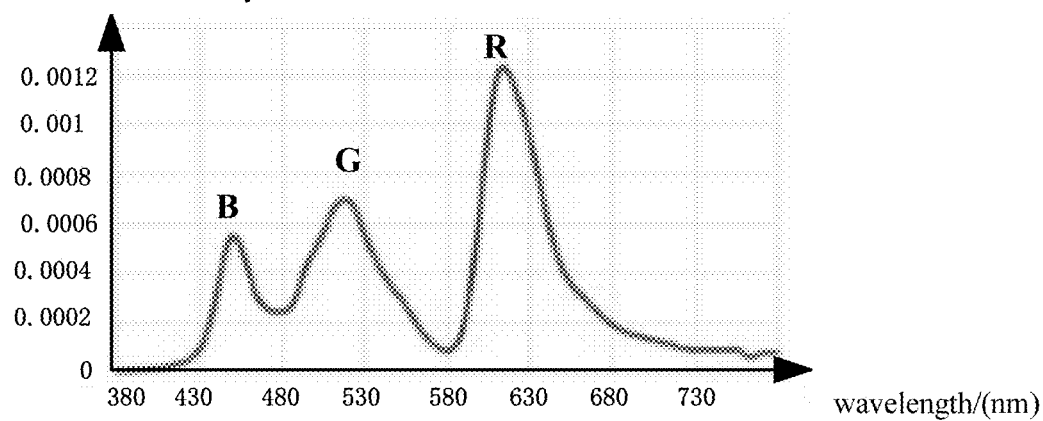
FIG. 1B is a first spectrogram of the OLED display light-emitting device.

FIG. 1A shows a schematic diagram in which a color cross-talk occurs in an OLED display device, and FIG. 1B is a spectrogram of the OLED display device. The OLED display device realizes full-color display by a white light OLED in conjunction with a color filter layer. As shown in FIGS. 1A and 1B, when the sub-pixel of a red light area (R) is turned on, an adjacent green light area (G), for example, in a non-light emitting state, emits light due to an electric leakage in the carrier injection layer (CGL) 1, thereby reducing purity of the light emitted by a single sub-pixel (for example, a red, green or blue sub-pixel), resulting in reduction of the color gamut of the entire OLED display device.

Figure 1C:
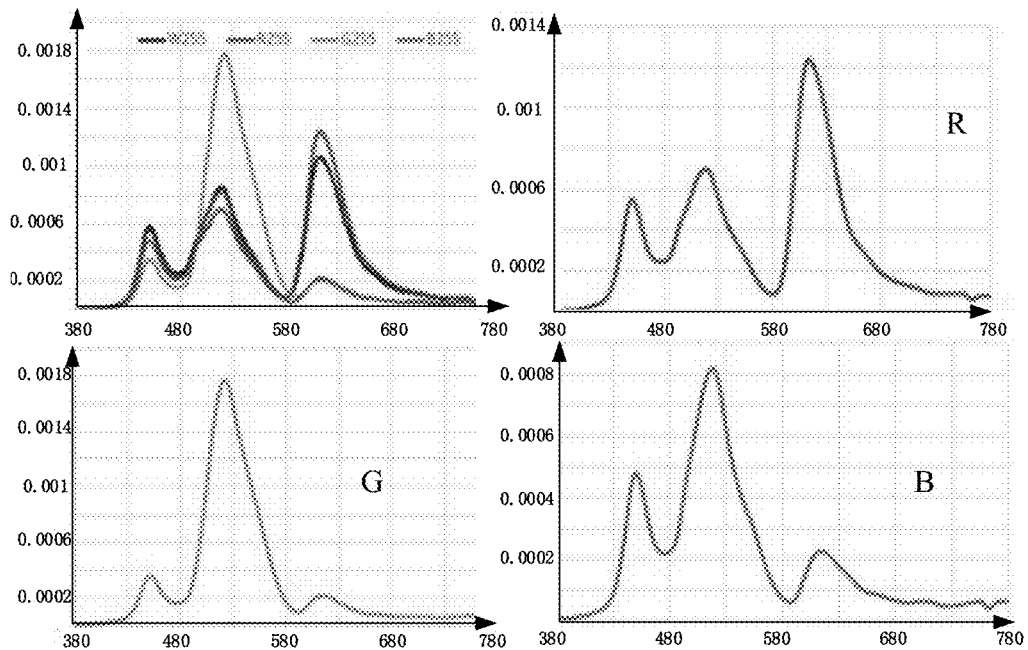
FIG. 1C is a second spectrogram of the OLED display light-emitting device.

FIG. 1C shows another example of the spectrogram of the OLED display device, and shows a spectrogram when the red (R), green (G) and blue (B) sub-pixels are turned on simultaneously and spectrograms when the three types of sub-pixels are turned on respectively. As shown, when the three types of sub-pixels are turned on respectively, light of different colors escapes from the adjacent sub-pixels, which reduces the color gamut of the entire OLED display device. According to a calculation, the OLED display device has a color gamut index (NTSC) of only 30%.

Embodiments of the present disclosure provide a display substrate, and a spacer is provided between adjacent sub-pixel areas, such that a carrier injection layer is naturally divided at the spacer during deposition. That is, the carrier injection layer in the adjacent sub-pixel areas is divided by the spacer, thereby effectively avoiding a color cross-talk between sub-pixels caused by a lateral electric leakage of the carrier injection layer, and improving a color gamut of the display substrate and a display quality.

Figure 2A:
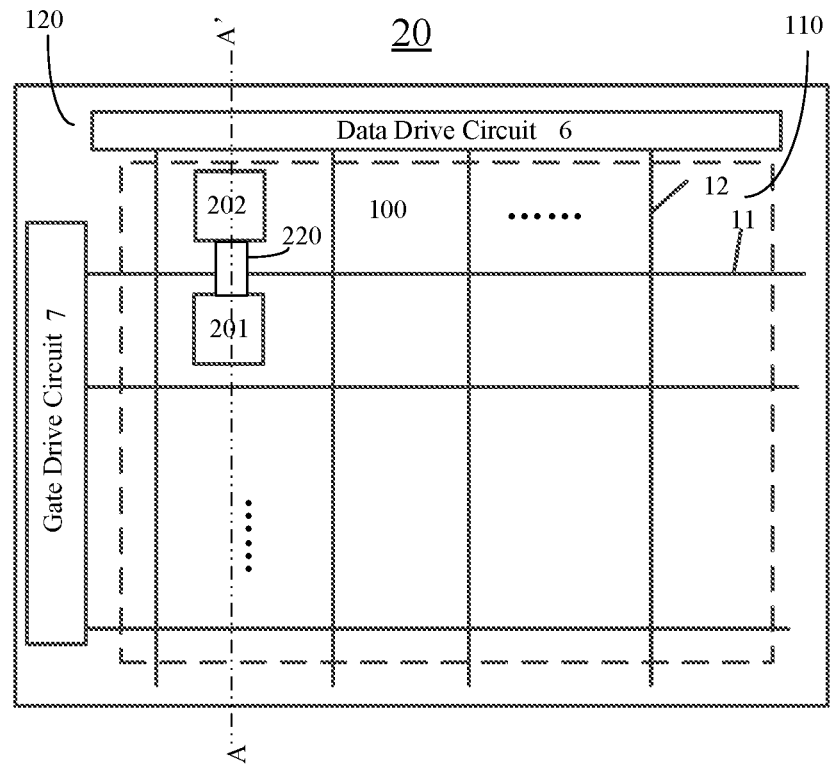
FIG. 2A is a first schematic planar diagram of a display substrate according to some embodiments of the present disclosure.

FIG. 2A is a schematic planar diagram of a display substrate according to embodiments of the present disclosure. As shown, the display substrate 20 includes a plurality of gate lines 11 and a plurality of data lines 12, the plurality of gate lines 11 and the plurality of data lines 12 intersect with one other to define a plurality of sub-pixel areas 100 distributed in an array in a display area 110, each sub-pixel area 100 is provided with a sub-pixel, and each sub-pixel includes a light-emitting element and a drive circuit for driving the light-emitting element. The drive circuit is configured as a conventional pixel circuit, for example. For example, the drive circuit includes a conventional nTmC (n and m are positive integers) pixel circuit, such as a 2T1C (i.e., two transistors and a capacitor) pixel circuit, a 4T2C pixel circuit, a 5T1C pixel circuit, a 7T1C pixel circuit, or the like, and in various embodiments, the drive circuit may further include a compensation circuit including an internal compensation circuit or an external compensation circuit, and the compensation circuit may include a transistor, a capacitor, or the like. For example, the drive circuit may further include a reset circuit, a light-emitting control circuit, a detection circuit, or the like, as required. For example, the display substrate may further include a data drive circuit 6 and a gate drive circuit 7 which are located in a non-display area 120 outside the display area 110 and connected with the drive circuit of the light-emitting element through the data line 12 and the gate line 11 respectively, so as to supply electric signals. The data drive circuit is configured to provide a data signal, and the gate drive circuit is configured to provide a scanning signal, and may further be configured to provide various control signals, power signals, or the like.

In some other examples, for example, a silicon substrate is adopted as a base substrate 101 of the display substrate, and the drive circuit (pixel circuit) 206, the gate drive circuit 6 and the data drive circuit 7 may be integrated at the silicon substrate. In this case, because a silicon-based circuit may achieve higher accuracy, the gate and data drive circuits 6, 7 may also be formed in an area corresponding to the display area of the display substrate, for example, and are not necessarily located in the non-display area.

Figure 2B:
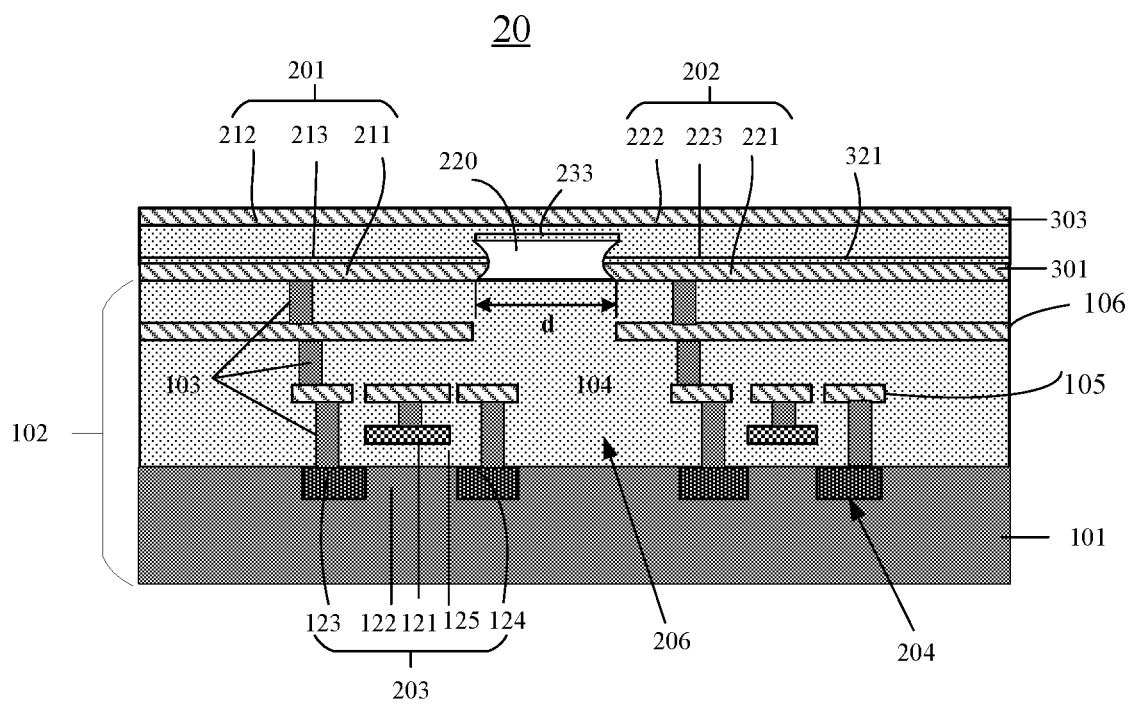
FIG. 2B is a first sectional view of the display substrate according to some embodiments of the present disclosure.

FIG. 2B shows an example of a sectional view of the display substrate shown in FIG. 2A along direction A-A'. For clarity, only the adjacent first sub-pixel area and the second sub-pixel area are shown in the drawing, and for each sub-pixel area, only the light-emitting element and the transistor in the drive circuit 206 directly connected with the light-emitting element are shown. For example, the transistor may be a driving transistor which is configured to control a current for driving the light-emitting element to emit light. For example, the transistor may also be a light-emitting control transistor which is configured to control a flow of the current for driving the light-emitting element to emit light, which is not limited in the embodiments of the present disclosure. As shown in FIG. 2B, the display substrate 20 includes a base substrate 101, as well as a first conductive layer 301, an organic functional layer 302 and a second conductive layer 303 which are provided at the base substrate 101. The organic functional layer 302 includes a carrier injection layer 321. The first conductive layer 301 includes a first electrode 211 and a second electrode 221 which are in the first sub-pixel area and the second sub-pixel area respectively, and are separated from each other. The second conductive layer 303 includes a third electrode 212 and a fourth electrode 222 which are in the first sub-pixel area and the second sub-pixel area respectively and are connected with each other. The third and fourth electrodes 212, 222 are of an integrated structure, i.e., a continuous smooth structure formed by the same conductive material layer, and no interface exists between different areas in the second conductive layer.

As shown in FIG. 2B, the display substrate according to the embodiments of the present disclosure may be formed on a silicon substrate, and the drive circuit 206 may be integrated in the silicon substrate to form a driving substrate 102. A first light-emitting element 201 and a second light-emitting element 202 are formed on the driving substrate 102 including the silicon substrate 101, and the driving substrate includes the drive circuit 206 formed at the silicon substrate 101 made of single crystal silicon or high purity silicon, for example. The drive circuit 206 is formed at the silicon substrate 101 with a semiconductor technology. For example, an active layer (i.e., a semiconductor layer), a first electrode and a second electrode of the transistor are formed in the silicon substrate 101 with a doping technology, an insulating layer 104 is formed with a silicon oxidation technology, and the plurality of conductive layers 105, 106, or the like, are formed with a sputtering technology. The semiconductor layer (for example, the active layer 122 in FIG. 2B) of the transistor is inside the base substrate 101 or serves as a part thereof.

Figure 2C:
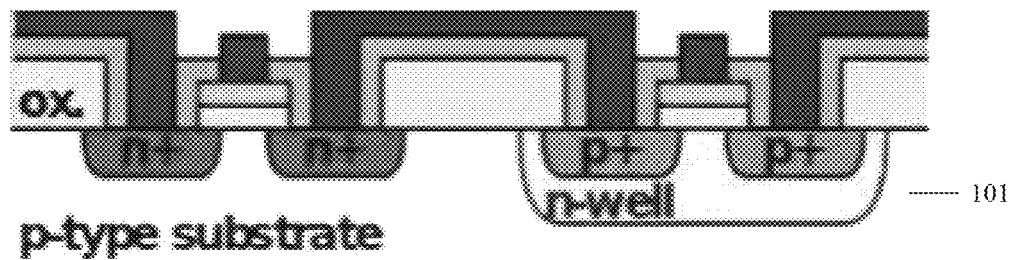
FIG. 2C is a second sectional view of the display substrate according to some embodiments of the present disclosure.

For example, the drive circuit 206 includes a complementary metal oxide semiconductor circuit (CMOS circuit). FIG. 2C shows a specific example in which a PMOS transistor and an NMOS transistor are formed in the silicon substrate. As shown in FIG. 2C, the NMOS and PMOS transistors are integrated in a P-type silicon substrate, an active layer of the NMOS transistor serves as a part of the P-type substrate, and an active layer of the PMOS transistor is obtained by performing N-type doping at the P-type substrate.

For example, the above-mentioned gate and data drive circuits 6, 7 may also be integrated in the silicon substrate 101 with the above-mentioned semiconductor technology. The gate and data drive circuits may have conventional circuit structures in the art, which is not limited in the embodiments of the present disclosure.

As shown in FIG. 2B, the first electrode 211 of the first light-emitting element 201 is formed on a surface of the driving substrate 102, and is electrically connected with the first electrode 123 of the first transistor 203 through a contact hole 103 filled with a conductive material (for example, tungsten) and the plurality of conductive layers. FIG. 2B exemplarily shows one insulating layer 104 and two conductive layers 105, 106. However, numbers of the insulating layer 104 and the conductive layer are not limited in the embodiments of the present disclosure.

For example, as shown in FIG. 2B, the topmost conductive layer 106 in the driving substrate 102 has reflectivity, and is of a titanium/titanium nitride/aluminum stacked structure, for example. For example, the conductive layer 106 includes a plurality of sublayers which are spaced apart and arranged in one-to-one correspondence to the plurality of electrodes included in the first conductive layer 301. In a top-emitting structure, the conductive layer 106 may be configured as a reflective layer for reflecting the light emitted by the light-emitting element to improve a light outgoing efficiency. For example, an orthogonal projection of each electrode in the first conductive layer 301 at the base substrate 101 falls within an orthogonal projection of a portion of the conductive layer 106 corresponding to the electrode at the base substrate 101. In this case, the first conductive layer 301 may be made of a transparent conductive oxide material having a high work function, such as ITO, IZO, IGZO, AZO, or the like.

Depending on a mature CMOS integrated circuit technology, a silicon-based technology may achieve higher accuracy (for example, PPI may be up to 6500 or even more than ten thousand). For example, the first electrodes 211, 221 of the first and second light-emitting elements 201, 202 have spacing (i.e., a width of a spacer 202) d less than 1 micron.

The organic functional layer 302 includes a first organic functional layer and a second organic functional layer which are located at the first sub-pixel area and the second sub-pixel area respectively. The first light-emitting element 201 is formed by the first electrode 211, the first organic functional layer and the third electrode 212, and the second light-emitting element 202 is formed by the second electrode 221, the second organic functional layer and the fourth electrode 222.

For example, the first/second light-emitting element 201/202 may be configured as an organic light-emitting diode (OLED), or a quantum dot light-emitting diode (QLED), or the like, and the type of the light-emitting element is not limited in the embodiments of the present disclosure. For example, a light-emitting layer of the OLED may be made of a small-molecular organic material or a high-molecular organic material.

For example, the first and second light-emitting elements 201, 202 are of top-emitting structures, and the first and second electrode 211, 221 have reflectivity. For example, the first electrodes 211, 221 include materials with a high work function and high reflectivity to serve as anodes, and for example, have a Ti/Al/Ti/Mo stacked structure in which metallic titanium may serve as a buffer layer to improve adhesiveness between layers, Al may serve as a highly reflective material, and Mo may serve as a material with a high work function to come into direct contact with the organic functional layer, thereby improving a carrier injection capability. Correspondingly, the second conductive layer 303 serves as a cathode, and may be made of a transparent conductive material or has a stacked structure of a transparent conductive material and a metal material, for example. For example, the second conductive layer 302 may be made of a transparent metal oxide conductive material, such as indium zinc oxide (IZO), indium tin oxide (ITO), indium gallium zinc oxide (IGZO), or the like, and may also be made of a transparent nano conductive material, such as a carbon nanotube, graphene, a nano silver wire, or the like.

The organic functional layer 302 includes layers stacked at each other in a direction perpendicular to the substrate 101, including at least one carrier injection layer and at least one light-emitting layer. The carrier injection layer may be configured as an electron injection layer (EIL) or a hole injection layer (HIL). The electron injection layer, located at a side of the light-emitting layer close to the cathode, is configured to lower a barrier for electron injection from the cathode, such that electrons may be effectively injected into the light-emitting layer from the cathode. The hole injection layer, located at a side of the light-emitting layer close to the anode, is configured to lower a barrier for hole injection from the anode, such that holes may be effectively injected into the light-emitting layer from the anode. Therefore, a matching degree between a material energy level and an electrode material is required to be considered during selection of a material of the electron/hole injection layer. For example, the electron injection layer may be made of LiQ (8-hydroxyquinoline lithium), AlQ3 (8-hydroxyquinoline aluminum), or the like; the hole injection layer may be made of CuPc (polyester carbonate), TiOPc, m-MTDATA, 2-TNATA, or the like.

For example, the organic functional layer 302 may further include an electron/hole transport layer, an electron/hole barrier layer, a charge generation layer, or the like, as required.

FIG. 2B only schematically shows a carrier injection layer 321 close to the first conductive layer 301 in the organic functional layer 302, and the other functional layers are not labeled in detail. The carrier injection layer 321 includes a first carrier injection layer portion 213 and a second carrier injection layer portion 223 located at the first sub-pixel area and the second sub-pixel area respectively. The display substrate 20 further includes a spacer 220 located between the first and second light-emitting elements 201, 202 and separating the first carrier injection layer 213 and the second carrier injection layer portion 223. For example, as shown in FIG. 2B, the spacer 220 is located between the first and second electrodes 211, 221, and extends in a direction perpendicular to the base substrate 101, so as to separate the first carrier injection layer 213 and the second carrier injection layer portion 223. That is, the first carrier injection layer 213 and the second carrier injection layer portion 223 are spaced away from each other without connection and contact.

As shown in FIG. 2B, the carrier injection layer 302 further includes a third portion 233 of the carrier injection layer which is between the spacer 220 and the second conductive layer 303, and is separated from the first carrier injection layer 213 and the second carrier injection layer portion 223 respectively.

As shown in FIG. 2B, the spacer 220 has a recessed portion (as viewed from an end of the spacer away from the base substrate) at a side surface adjacent to the first and second portions 213, 223 of the carrier injection layer. For example, the recessed portion is directly connected with a top surface (surface away from the base substrate) of the spacer 220. The side surface of the spacer 220 may include a smooth concave curved surface, a non-smooth recessed surface, or a combination of a plurality of recessed surfaces. A specific form of the recessed portion is not limited in the embodiments of the present disclosure.

Figure 3A:
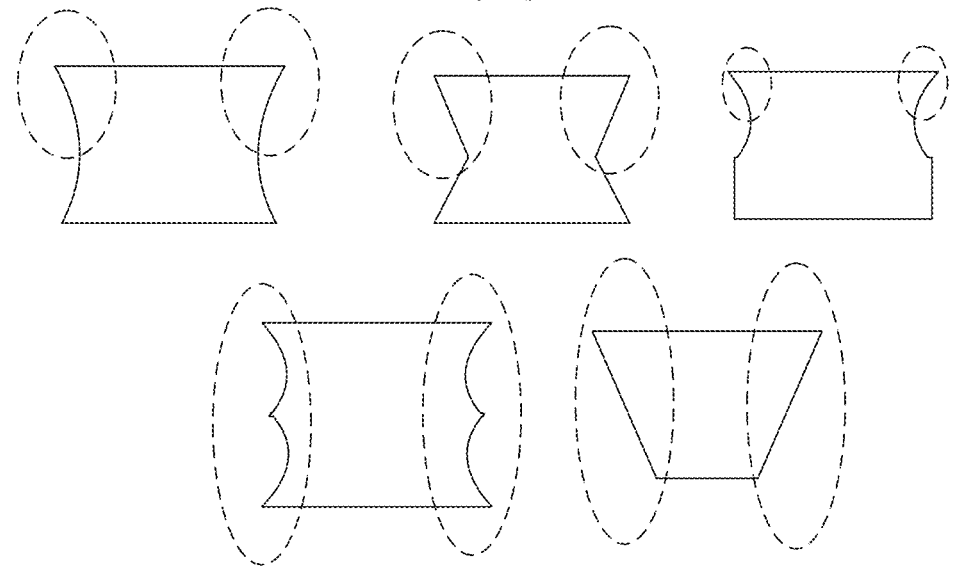
FIG. 3A is a schematic diagram of a cross-section shape of a spacer according to some embodiments of the present disclosure.

FIG. 3A shows schematic diagrams of several sectional shapes of the spacer which is placed with a right side up. That is, the base substrate is located below each spacer in the drawing. For example, in some examples, the spacer 220 has a width reduced first and then increased in a direction away from the base substrate 101.

In some other examples, the farther from the base substrate 101, the larger a cross sectional area of the spacer 220 parallel to the base substrate 101; for example, the spacer has an inverted trapezoidal section in the direction perpendicular to the base substrate 101.

In further examples, the spacer 220 has a rectangular section in the direction perpendicular to the base substrate 101.

In a deposition process of the organic material, due to a small thermal evaporation energy, the organic material has poor step coverage and has difficulty in attachment to the recessed portion (for example, the surface marked by the dotted line in FIG. 3A) or a vertical surface, such that the carrier injection layer 321 is disconnected at the corresponding spacer 220, i.e. between adjacent sub-pixels, thereby avoiding the electric leakage of the carrier injection layer between different sub-pixels, and also avoiding problems of the color cross-talk, color gamut reduction, or the like, caused by the electric leakage.

For example, in at least one embodiment, the spacer 220 includes an antireflection coating (ARC) layer including an antireflection organic material. For example, the antireflection coating layer may serve as a bottom antireflection coating (BARC) in photolithography, which may effectively suppress a standing wave effect caused by light reflected by the substrate in a photoresist layer, and improve a line width uniformity of the photolithography and etching accuracy of photoresist.

For example, the antireflection coating layer is made of an organic material, such as an organic polymer or copolymer, which is readily soluble in a developing solution of the photoresist which is used cooperatively with the antireflection coating layer. For example, a material of the antireflection coating layer includes a monomer unit having an alkene, alkyne or aromatic group. For example, the antireflection coating layer is made of an ester, acrylate or isocyanate monomer. For example, the antireflection coating layer is made of an acrylate polymer or copolymer or a styrene polymer or copolymer. Depending on the material of the antireflection coating layer, and after the photoresist is determined, the developing solution is selected correspondingly.

For example, the spacer 220 is made of a negative photoresist material or an inorganic insulating material, such as a nitride or an oxide of silicon.

By providing the spacer 220 between the first and second light-emitting elements 201, 202, the carrier injection layer may be divided between the adjacent sub-pixel areas, thereby effectively avoiding the color cross-talk between the sub-pixels caused by the lateral electric leakage of the carrier injection layer, increasing the color gamut of the display substrate, and improving the display quality.

Figure 3B:
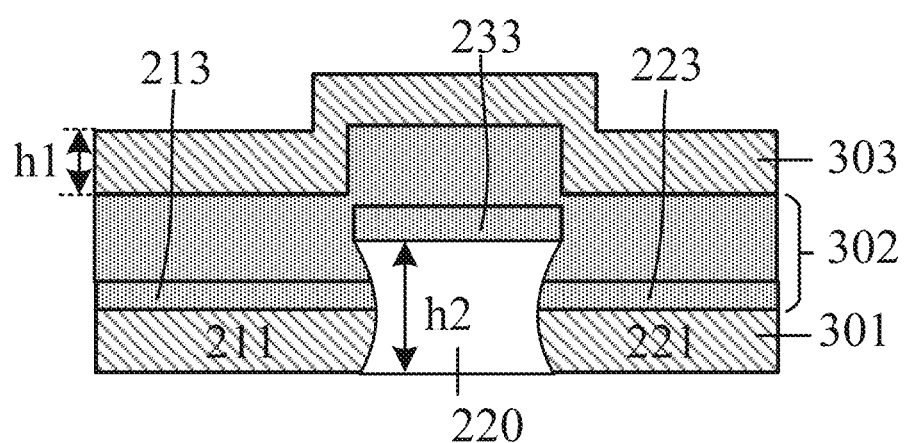
FIG. 3B is an enlarged view of a portion of the display substrate according to some embodiments of the present disclosure.

FIG. 3B illustrates a schematic enlarged diagram of a portion of the display substrate at the spacer 220, and as shown, a ratio of a thickness h1 of the second conductive layer 303 to a thickness h2 of the spacer ranges from 0.5 to 2 in the direction perpendicular to the base substrate 101. For example, the spacer 220 has a thickness ranging from 100 to 250 nanometers and an average width ranging from 0.5 to 1.2 microns. For example, the second conductive layer 303 has a thickness ranging from 100 to 300 nanometers. For example, the second conductive layer serves as the cathode and is made of a stacked structure of a metal and a transparent metal oxide conductive material. For example, the second conductive layer 303 has a Mg/Ag/IZO stacked structure, and Mg/Ag materials are closer to the organic functional layer 302 and have a thickness of a dozen of nanometers. This is because the metal has a lower work function than the metal oxide conductive material, and direct contact with the organic functional layer may improve the injection capability of carriers (electrons).

Figure 3C:
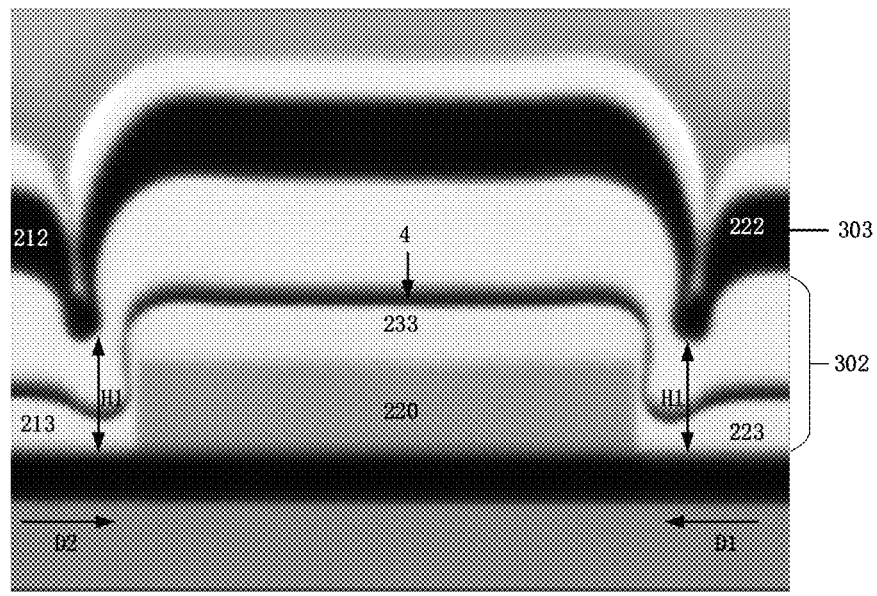
FIG. 3C is an SEM image of the display substrate according to some embodiments of the present disclosure.

FIG. 3C shows a sectional scanning electron microscope (SEM) image of a portion of the display substrate. As shown in FIG. 3C, the spacer 220 has a rectangular section in the direction perpendicular to the base substrate 101. A layer shown in black indicated by reference numeral 4 in the drawing is configured as an auxiliary layer for assisting judgment, which is formed above and immediately adjacent to the charge generation layer, and does not exist in an actual device. As may be seen from FIG. 3A, a portion of the organic functional layer including the carrier injection layer 321 located below the auxiliary layer 4 is separated almost totally at the corresponding spacer 220.

For example, as shown in FIG. 3C, the organic functional layer has a small thickness H1 near the spacer 220, which is caused by the difficulty in attachment of the organic material to a sidewall of the spacer 220 having a large slope. For example, the organic functional layer 302 becomes thinner gradually in directions D1, D2 directed from a center of the sub-pixel area towards the spacer 220.

For example, as shown in FIG. 3C, similarly, the second conductive layer 303 has a smaller thickness near the spacer 220, which is caused by the difficulty in attachment of the deposited material to the sidewall of the spacer 220 having a large slope due to the small thermal evaporation energy in an evaporation technology. For example, the second conductive layer 303 becomes thinner gradually in the directions D1, D2 directed from the center of the sub-pixel area towards the spacer 220.

As shown in FIG. 3C, the third and fourth electrodes 212, 222 are in an integrated structure, and the second conductive layer 302 has a continuous smooth structure without an interface therebetween.

For example, in order to prevent the second conductive layer 303 from being broken, the second conductive layer 303 may have a thickness greater than 100 nanometers.

For example, the first and second light-emitting elements 201, 202 are configured to emit white light respectively. A structure and a light-emitting mechanism of the organic functional layer 302 are not limited in the embodiments of the present disclosure.

For example, in order to increase the light-emitting efficiency and the color gamut of a light-emitting device, a plurality of light-emitting layers stacked at each other may be adopted to emit white light. That is, the organic functional layer 302 includes a plurality of light-emitting layers stacked in the direction perpendicular to the base substrate 101. For example, the organic functional layer 302 includes two light-emitting layers (yellow and blue) or three light-emitting layers (red, green and blue) stacked at each other.

For example, at least two of the plurality of light-emitting layers are connected in series with each other by a charge generation layer (CGL) to form a tandem structure, and the charge generation layer includes an N-type charge generation layer and a P-type charge generation layer, for balancing transport of the carriers. The N-type charge generation layer may be formed by an organic layer doped with an alkali metal, such as lithium (Li), sodium (Na), potassium (K) or cesium (Cs), or an alkaline earth metal, such as magnesium (Mg), strontium (Sr), barium (Ba) or radium (Ra) (but not limited to any one of them); the P-type charge generation layer may be formed by an organic layer obtained by doping an organic host material having a hole transport capability with a dopant. The tandem structure contributes to improvement in the light-emitting efficiency and light-emitting luminance of the device.

For example, the adjacent light-emitting layers have corresponding light-emitting energy levels which are relatively close, such that the light-emitting element has a wide selection range of materials, such as the material of the light-emitting layer, the electron and hole transport materials, the electrode material, or the like, with low implementation difficulty.

Figure 4:
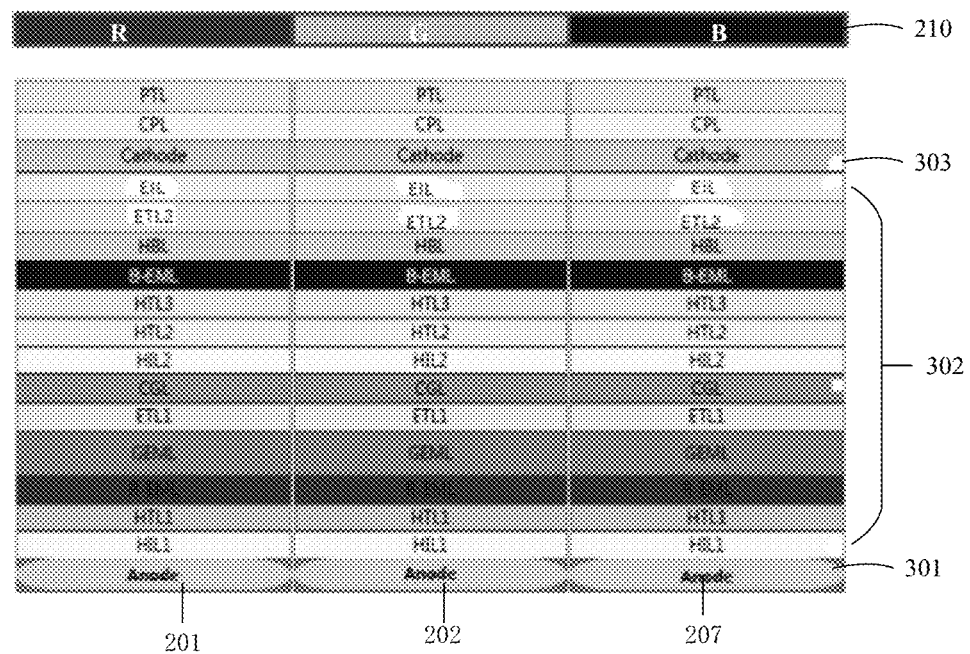
FIG. 4 is a schematic structural diagram of the display substrate according to some embodiments of the present disclosure.

FIG. 4 shows a schematic diagram of the display substrate according to some other embodiments of the present disclosure. As shown in FIG. 4, the display substrate 20 further includes a third light-emitting element 207. For example, the first, second and third light-emitting elements 201, 202, 207 are located in different sub-pixels respectively, thereby forming a pixel unit PX which may emit full-color light in conjunction with a color filter layer 210.

The light-emitting element shown in FIG. 4 further includes the charge generation layer (CGL) and has a tandem structure. As shown in FIG. 4, the organic functional layer 302 includes a red light-emitting layer, a green light-emitting layer and a blue light-emitting layer, the red and green light-emitting layers are adjacent to each other to form a red-green light-emitting layer which is connected with the blue light-emitting layer in series, and the charge generation layer is located between the red-green light-emitting layer and the blue light-emitting layer.

For example, the organic functional layer 302 shown in FIG. 4 includes a plurality of carrier injection layers (HIL1, HIL2, EIL), for example, at least one of the carrier injection layers is divided by the spacer 220. In some other examples, the organic functional layer 302 is completely divided by the spacer 220. That is, all the carrier injection layers are divided by the spacer 220; in this case, the charge generation layer is also divided by the spacer 220. That is, a first charge generation layer portion located in the first sub-pixel area is separated from a second charge generation layer portion located in the second sub-pixel area.

For example, the organic functional layer 302 further includes an electron transport layer (ETL1) and a hole transport layer (HTL2) located at both sides of the charge generation layer respectively, the N-type charge generation layer in the charge generation layer is closer to the electron transport layer, and the P-type charge generation layer in the charge generation layers is closer to the hole transport layer.

For example, one of the first and second conductive layers has reflectivity, and the other has a semi-transmission or light transmission performance. For example, in the first light-emitting element 201, a microcavity is formed by the first and third electrodes 211, 212, such that a distance from each light-emitting layer to the reflective layer and a wavelength of the light emitted by the light-emitting layer satisfy $2\Delta=m\lambda$ (m=1, 2, 3, . . . ), wherein $\Delta$ is an optical path length which is equal to a refractive index of a medium multiplied by a propagation distance of the light in the medium, such that emitted light and reflected light resonate in the microcavity, thereby improving purity of the emitted light and further increasing the color gamut and the luminance of the emitted light of the display substrate.

For example, the light-emitting element has a top-emitting structure, in which case the first conductive layer has reflectivity and the second conductive layer has a semi-transmission or light transmission performance. For example, the red and green light-emitting layers are located at a side of the carrier injection layer close to the first conductive layer, and the blue light-emitting layer is located at a side of the carrier injection layer away from the first conductive layer.

By this arrangement, the respective light-emitting layers may satisfy the above-mentioned relationship, and the purity and luminance of the emitted light may be improved. On the other hand, the red, green and blue light-emitting layers are sequentially stacked at the first conductive layer 301, and the red light-emitting layer is closer to the first conductive layer. Since a long-wave light-emitting material tends to absorb a short wave, this arrangement prevents the emitted light from being absorbed by other light-emitting layers, thereby improving the light outgoing efficiency.

For example, the first conductive layer 301 is formed as the anode of the light-emitting element, and the second conductive layer 303 is formed as the cathode of the light-emitting element. For example, the first conductive layer 301 is made of a material with a high work function as well as high reflectivity, for example, and for example, has a Ti/Al/Ti/Mo stacked structure in which metallic titanium may serve as a buffer layer to improve adhesiveness between layers, Al may serve as a high reflective material, and Mo may serve as a material with a high work function to come into direct contact with the organic functional layer, thereby improving the carrier injection capability. For example, the second conductive layer 303 may be made of a conductive material with a low work function and a high transmittance, for example, a transparent metal oxide conductive material, such as indium zinc oxide (IZO), indium tin oxide (ITO), indium gallium zinc oxide (IGZO), or the like, or a transparent nano conductive material, such as a carbon nanotube, graphene, a nano silver wire, or the like. For example, in order to prevent the second conductive layer 303 from being broken due to the arrangement of the spacer 220, the second conductive layer 303 may have a thickness greater than 100 nanometers. In a case where the second conductive layer 303 is configured as a transparent conductive layer, since the transparent conductive layer means a high light transmittance, the thickness has a small influence on the light transmittance of the transparent conductive layer.

For example, the red, green and blue light-emitting layers are made of CBP:(ppy)2Ir(acac), CBP:FIrpic and CBP: btp2Ir(acac) obtained by doping phosphorescent materials for red light, green light and blue light into host materials respectively.

With continued reference to FIG. 2B, FIG. 2B shows a first transistor 203 and a second transistor 204 which are electrically connected with the first and second light-emitting elements 201, 202 respectively. Specific types of the first and second transistors 203, 204 are limited in the embodiments of the present disclosure. The first transistor 203 is exemplarily described below, and the description is also applicable to the second transistor 204, and thus is not repeated.

For example, the first transistor 203 includes a gate electrode 121, a gate insulating layer 125, an active layer 122, a first electrode 123 and a second electrode 124. A type, a material and a structure of the first transistor 203 are not limited in the embodiments of the present disclosure, and for example, the first transistor 203 may be of a top gate type, a bottom gate type, or the like. The active layer of the first transistor 203 may be made of an inorganic semiconductor material, such as microcrystalline silicon, amorphous silicon, polycrystalline silicon (low temperature polycrystalline silicon or high temperature polycrystalline silicon), an oxide semiconductor (for example, IGZO), or the like, or an organic semiconductor material, such as PBTTT, PDBT-co-TT, PDQT, PDVT-10, dinaphtho-bithiophene (DNTT), or pentacene, or the like. For example, the first transistor 203 may be of an N-type or P-type.

For example, the first electrode 123 of the first transistor 203 is electrically connected with the first electrode 211 of the first light-emitting element 201.

It should be noted that the transistors in the embodiments of the present disclosure may all be configured as thin film transistors, field effect transistors or other switching devices with the same characteristics, and some embodiments of the present disclosure are described by taking a field effect transistor (such as an MOS field effect transistor) formed in the silicon substrate as an example in which a doping process (p-type doping or n-type doping) is performed on the silicon substrate to form the active layer of the transistor; that is, the active layer of the transistor is located in the silicon substrate, or serves as a part of the silicon substrate.

A source electrode and a drain electrode of the transistor used herein may have a symmetrical structure, such that no difference exists between the structures of the source and drain electrodes. In the embodiments of the present disclosure, in order to distinguish the two electrodes of the transistor other than the gate electrode, for example, one of the electrodes may be described as the first electrode directly, and the other may be described as the second electrode.

Figure 5:
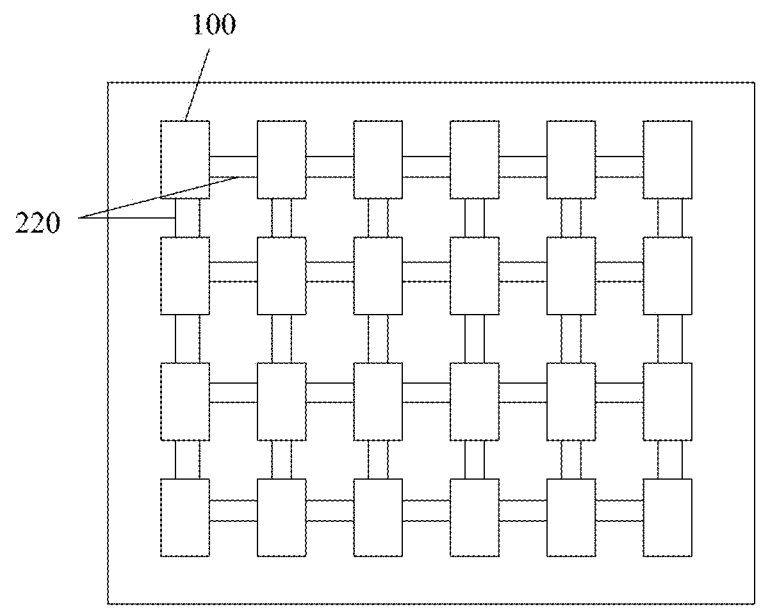
FIG. 5 is a second schematic planar diagram of the display substrate according to some embodiments of the present disclosure.

FIG. 5 shows a schematic planar diagram of the display substrate 20 according to further embodiments of the present disclosure. As shown, the spacer 220 is provided between every two adjacent (including in a row direction and in a column direction of the pixel array) sub-pixel areas 100 (light-emitting elements).

Figure 6:
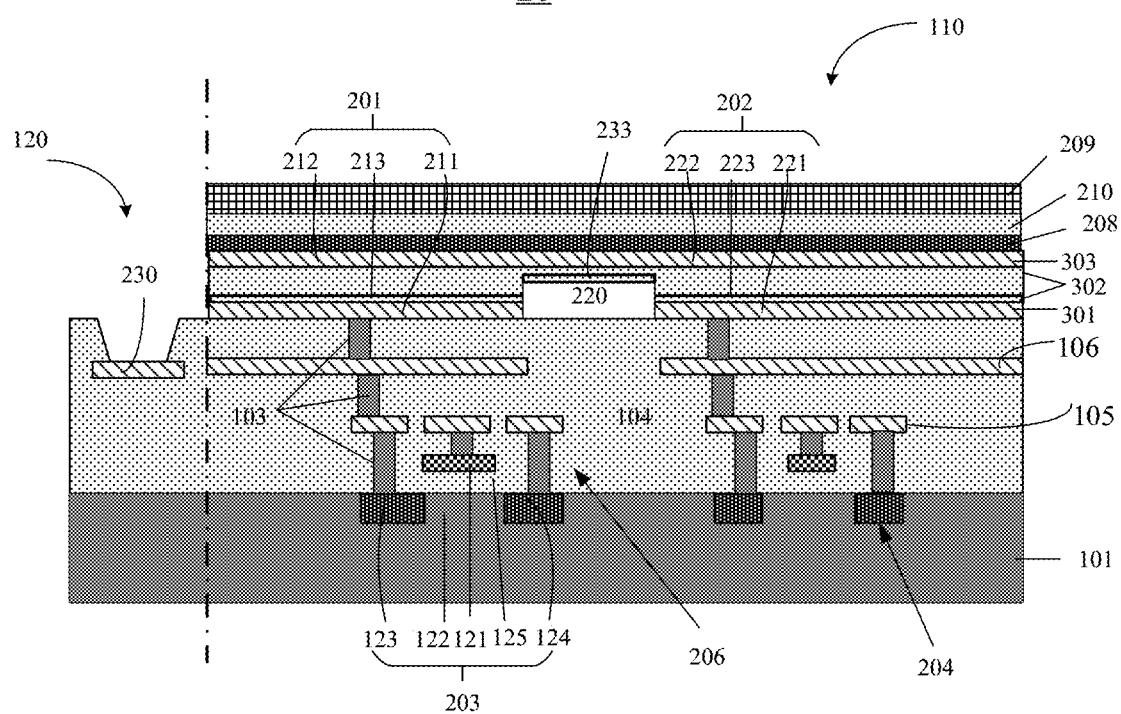
FIG. 6 is a third sectional view of the display substrate according to some embodiments of the present disclosure.

FIG. 6 shows another example of a sectional view of FIG. 2A along direction A-A'. As shown, the display substrate 20 further includes a bonding pad 230 which, located in the non-display area 120, is generally configured to bond an external element to provide a signal, for example, a power voltage signal, to the display substrate after fabrication of devices in the display area. The bonding pad 230 may be provided at the same layer as a conductive structure in the display area 110 to save technologies. For example, the bonding pad 230 may be provided in the same layer as the topmost conductive layer (farthest from the base substrate 101) below the light-emitting element in the display area 110 to facilitate the subsequent bonding technology. For example, as shown in FIG. 6, the bonding pad 230 is provided in the same layer as a source/drain electrode layer of the transistor in the display area 110.

It should be noted that "provided in the same layer" in the embodiments of the present disclosure means that a plurality of structures are formed by performing same or different patterning processes on the same material film, and thus made of the same material.

For example, the display substrate further includes an encapsulation layer 208, a color filter layer 210, a cover plate 209, or the like, which are located at sides of the first and second light-emitting elements 201, 202 away from the base substrate 101. For example, the encapsulation layer 208 is configured to seal the light-emitting element to prevent damage to the device due to penetration of external moisture and oxygen to the light-emitting element and the pixel circuit. For example, the encapsulation layer 208 includes an organic thin film or a structure in which an organic thin film and an inorganic thin film are stacked alternately. For example, a water absorption layer may be further provided between the encapsulation layer 208 and the light-emitting element, and configured to absorb water vapor or sol remaining in the light-emitting element during the previous manufacturing technology. The cover plate 209 is configured as a glass cover plate, for example. For example, the cover plate 209 and the encapsulation layer 208 may are in an integrated structure.

For example, the display substrate 20 is configured as an organic light-emitting diode (OLED) display substrate or a micro OLED display substrate.

Figure 7A:
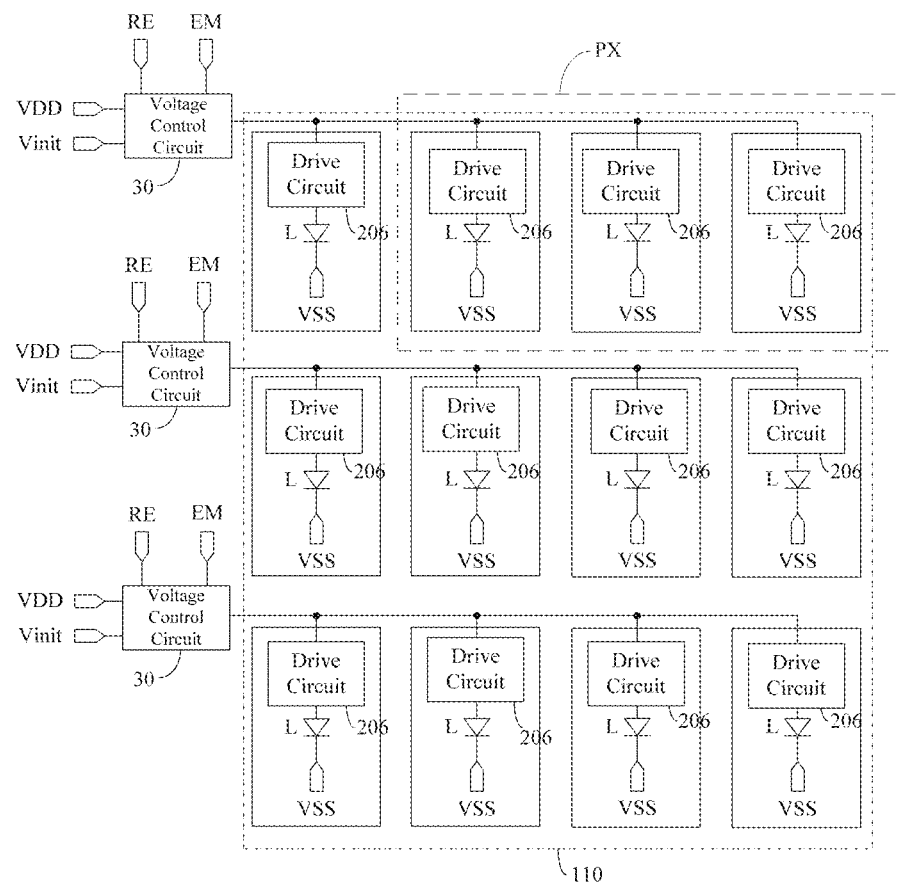
FIG. 7A is a schematic diagram of a principle of a drive circuit in the display substrate according to some embodiments of the present disclosure.

FIG. 7A is a schematic diagram of a principle of a drive circuit in the display substrate according to some embodiments of the present disclosure. The display substrate includes a plurality of light-emitting elements L (for example, the above-mentioned first and second light-emitting elements 201, 202) located in the display area 110 (AA area) and a drive circuit 206 coupled to each of the light-emitting elements L in one-to-one correspondence, and the drive circuit 206 includes a driving transistor configured to control a current for driving the light-emitting element to emit light. The display substrate may further include a plurality of voltage control circuits 30 located in the non-display area 120. For example, at least two drive circuits 206 in one row share one voltage control circuit 30, the first electrodes of the driving transistors in one row of drive circuits 206 are coupled to the shared voltage control circuit 30, and the second electrode of each driving transistor is coupled to the corresponding light-emitting element L. The voltage control circuit 30 is configured to output an initialization signal Vinit to the first electrode of the driving transistor in response to a reset control signal RE, so as to control the corresponding light-emitting element L to be reset, and configured to output a first power signal VDD to the first electrode of the driving transistor in response to a light-emitting control signal EM, so as to drive the light-emitting element L to emit light. By sharing the voltage control circuit 20, a structure of each drive circuit in the display area 130 may be simplified, and an occupied area of the drive circuit in the display area 130 may be reduced, such that more drive circuits and light-emitting elements may be provided in the display area 130 to implement an organic light-emitting display panel with high PPI. In addition, the voltage control circuit 30 outputs the initialization signal Vinit to the first electrode of the driving transistor under control of the reset control signal RE, so as to control the corresponding light-emitting element to be reset, thereby avoiding an influence of a voltage applied to the light-emitting element during a previous frame of light emission on a next frame of light emission, and then alleviating an image sticking phenomenon.

For example, the display substrate may further include a plurality of pixel units PX located in the display area 110, each pixel unit PX includes a plurality of sub-pixels, for example; and each sub-pixel includes one light-emitting element L and one drive circuit 206. Further, the pixel unit PX may include 3 sub-pixels of different colors. The 3 sub-pixels may emit white light respectively, and may emit full-color light in conjunction with the color filter layer.

Figure 8A:
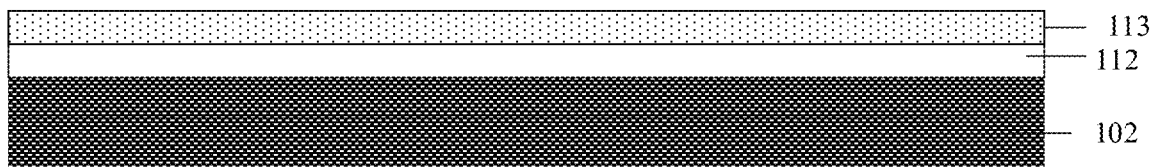
FIGS. 8A-8F are flow charts of a manufacturing method of a display substrate according to some embodiments of the present disclosure.

For example, the drive circuits 206 in at least two adjacent sub-pixels in the same row may share one voltage control circuit 30. For example, in some examples, as shown in FIG. 8A, all drive circuits 206 in the same row may share one voltage control circuit 30. Alternatively, in other examples, the drive circuits 206 in two, three or more adjacent sub-pixels in the same row may share one voltage control circuit 30, which is not limited here. Thus, the occupied area of the drive circuit 206 in the display area 110 may be reduced by sharing the voltage control circuit 30.

Figure 7B:
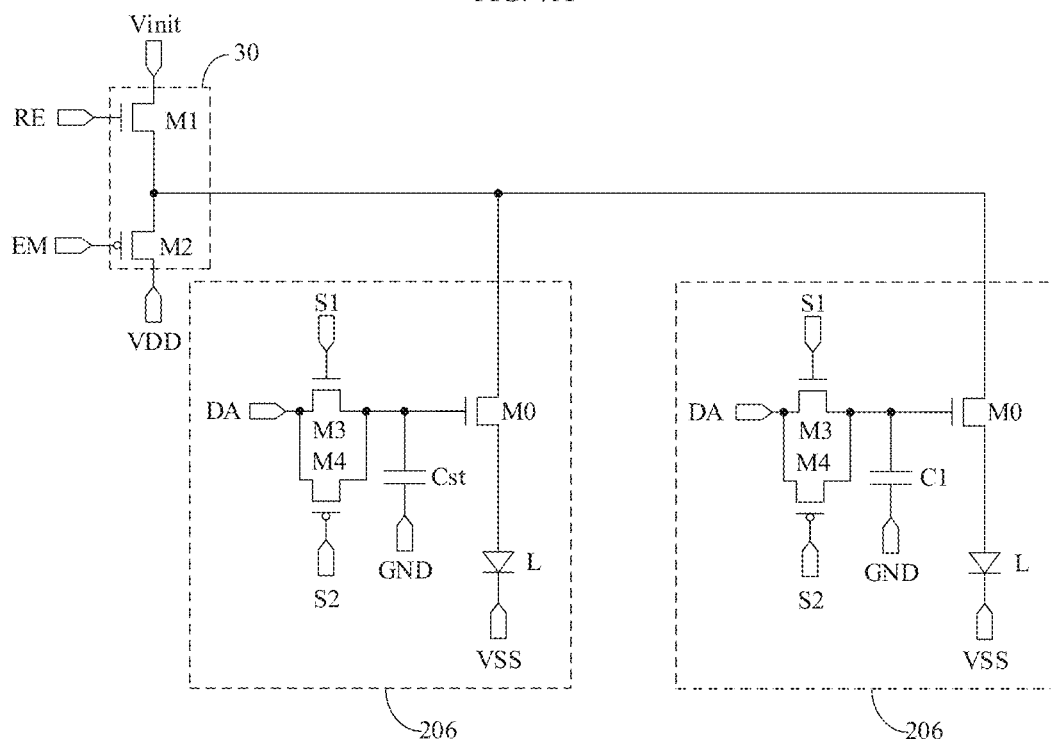
FIG. 7B is a circuit diagram of a specific implementation of a voltage control circuit and the drive circuit of the display substrate according to some embodiments of the present disclosure.

FIG. 7B is a circuit diagram of a specific implementation of the voltage control circuit and the drive circuit of the display substrate according to some embodiments of the present disclosure. For example, a driving transistor M0, for example, the first transistor 203 or the second transistor 204 mentioned above, in the drive circuit 206 is connected with the light-emitting element L directly. A positive electrode of the light-emitting element L is electrically connected with the driving transistor M0, and a negative electrode of the light-emitting element L is electrically connected with a second power terminal VSS. Generally, a voltage of the second power terminal VSS is a negative voltage or a ground voltage VGND (generally 0V), and a voltage of the initialization signal Vinit may be set to the ground voltage VGND, which is not limited here. For example, the light-emitting element L may be configured as a micro-OLED or a mini-OLED, which further facilitates implementation of the organic light-emitting display panel with high PPI.

For example, taking the two drive circuits 206 included in one row as an example, the voltage control circuit 30 may include a first switching transistor M1 and a second switching transistor M2. The gate electrode of the first switching transistor M1 is configured to receive the reset control signal RE, the first electrode of the first switching transistor M1 is configured to receive the initialization signal Vinit, and the second electrode of the first switching transistor M1 is coupled to the first electrode S of the corresponding driving transistor M0. The gate electrode of the second switching transistor M2 is configured to receive the light-emitting control signal EM, the first electrode of the second switching transistor M2 is configured to receive the first power signal VDD, and the second electrode of the second switching transistor M2 is coupled to the first electrode S of the corresponding driving transistor M0. For example, in some other embodiments, in order to reduce a wiring load and improve a pixel driving uniformity, a transistor may be connected in series between the first switching transistor M1 and the driving transistor M0.

For example, the first and second switching transistors M1, M2 may have different types. For example, the first switching transistor M1 is configured as an N-type transistor, and the second switching transistor M2 is configured as a P-type transistor. Alternatively, the first switching transistor M1 is configured as a P-type transistor, and the second switching transistor M2 is configured as an N-type transistor. Certainly, the first and second switching transistors M1, M2 may have the same type. In practical applications, the types of the first and second switching transistors M1, M2 are required to be designed according to practical application environments, which is not limited here.

For example, the drive circuit 206 may further include a third switching transistor M3 and a storage capacitor Cst. For example, the gate electrode of the third switching transistor M3 is configured to receive a first gate scanning signal S1, the first electrode of the third switching transistor M3 is configured to receive a data signal DA, and the second electrode of the third switching transistor M3 is coupled to the gate electrode G of the driving transistor M0. A first terminal of the storage capacitor Cst is coupled to the gate electrode G of the driving transistor M0, and a second terminal of the storage capacitor Cst is coupled to a ground terminal GND.

For example, the drive circuit 206 may further include a fourth switching transistor M4. For example, the gate electrode of the fourth switching transistor M4 is configured to receive a second gate scanning signal S2, the first electrode of the fourth switching transistor M4 is configured to receive the data signal DA, and the second electrode of the fourth switching transistor M4 is coupled to the gate electrode G of the driving transistor M0. In addition, the fourth and third switching transistor M4, M3 have different types. For example, the third switching transistor M3 is configured as an N-type transistor, and the fourth switching transistor M4 is configured as a P-type transistor; alternatively, the third switching transistor M3 is configured as a P-type transistor, and the fourth switching transistor M4 is configured as an N-type transistor.

It should be noted that when a voltage of the data signal DA is a voltage corresponding to a high grayscale, by turning on the fourth switching transistor M4 (for example, P-type) to transmit the data signal DA to the gate electrode G of the driving transistor M0, the voltage of the data signal DA may be prevented from being influenced by a threshold voltage of the third switching transistor M3 (for example, N-type). When the voltage of the data signal DA is a voltage corresponding to a low grayscale, by turning on the third switching transistor M3 (for example, N-type) to transmit the data signal DA to the gate electrode G of the driving transistor M0, the voltage of the data signal DA may be prevented from being influenced by a threshold voltage of the fourth switching transistor M4 (for example, P-type). Thus, a range of the voltage input to the gate electrode G of the driving transistor M0 may be increased.

The embodiments of the present disclosure further provide an electronic device including the above-mentioned display substrate 20. For example, the electronic device is configured as a product or component with any display function, such as a digital photo frame, a smart bracelet, a smart watch, a mobile phone, a tablet computer, a display, a notebook computer, a navigator, or the like.

The embodiments of the present disclosure further provide a manufacturing method of the above-mentioned display substrate, at least including: providing a base substrate; forming a first conductive layer, an organic functional layer and a second conductive layer at the base substrate in sequence and forming a drive circuit, wherein the first conductive layer includes a first electrode and a second electrode which are located in a first sub-pixel area and a second sub-pixel area respectively, the organic functional layer includes a carrier injection layer including a first carrier injection layer portion and a second carrier injection layer portion which are located in the first sub-pixel area and the second sub-pixel area respectively, the second conductive layer includes a third electrode and a fourth electrode which are located in the first sub-pixel area and the second sub-pixel area respectively; the first electrode, the first carrier injection layer portion and the third electrode form a first light-emitting element, and the second electrode, the second carrier injection layer portion and the fourth electrode form a second light-emitting element; the drive circuit is electrically connected with and configured to drive the first and second light-emitting elements with a spacer formed therebetween, the drive circuit includes a transistor including a semiconductor layer located inside the base substrate, the first carrier injection layer portion and the second carrier injection layer portion are separated by the spacer, and the carrier injection layer further includes a third carrier injection layer portion located between the spacer and the second conductive layer and spaced away from the first carrier injection layer portion and the second carrier injection layer portion respectively.

For example, referring to FIG. 2B, a silicon base substrate may be used as the base substrate, and the drive circuit 206 may be formed at the silicon substrate 101 with a CMOS integrated circuit technology, which may specifically refer to description of FIG. 2B and is not repeated herein. For example, these technologies may be completed in a foundry, and then a manufacturing technology of the light-emitting element, a subsequent encapsulation technology, or the like, are completed at the substrate 102 in a back-end panel factory.

For convenience of description, a manufacturing method of the first and second light-emitting elements will be mainly described below, and the base substrate and the drive circuit are collectively referred to as a driving substrate which is electrically connected with and configured to drive the first and second light-emitting elements to emit light.

FIGS. 8A-8F show flow charts of a manufacturing method of a display substrate according to some embodiments of the present disclosure.

As shown in FIG. 8A, an antireflection material layer 112 and a photoresist layer 113 are formed on the driving substrate 102 sequentially. In this embodiment, the antireflection material layer 112 is formed below the photoresist layer 13 and serves as a bottom antireflection coating (BARC) in photolithography, which may effectively suppress a standing wave effect caused by light reflected by the substrate in the photoresist layer 13, and improve the line width uniformity of the photolithography and etching accuracy of photoresist.

For example, the antireflection material layer 112 is made of an organic material, such as an organic polymer or copolymer, which is readily soluble in a developing solution of the photoresist layer 13. For example, the antireflection material layer 112 includes a monomer unit having an alkene, alkyne or aromatic group. For example, the antireflection material layer 112 includes an ester, acrylate or isocyanate monomer. For example, the antireflection material layer 112 includes an acrylate polymer or copolymer or a styrene polymer or copolymer.

Figure 8B:
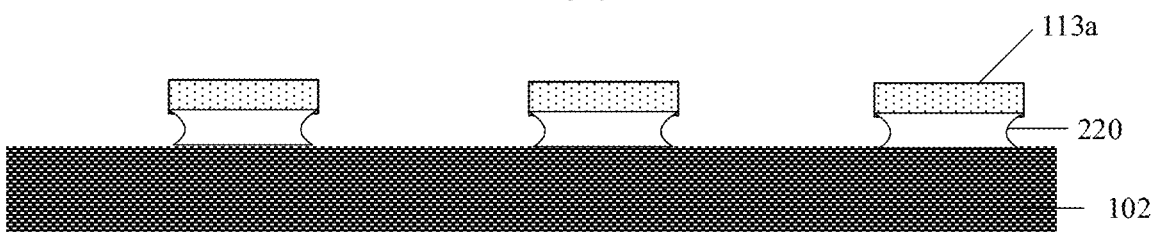

As shown in FIG. 8B, the exposed photoresist layer 113 is developed using the developing solution to obtain a photoresist pattern 113a, and meanwhile, the antireflection material layer 112 is etched by the developing solution to form a spacer 220 as shown.

As shown in FIG. 8B, a width of the spacer 220 in a direction away from the driving substrate 102 is not uniform, but is reduced first and then increased. This is because, on the one hand, a method of etching the antireflection material layer 112 by the developing solution is an isotropic wet etching method, and a lateral underetching phenomenon is likely to occur, and therefore, a width in a lateral direction tends to decrease from bottom to top; on the other hand, a top end of the spacer 220 close to the photoresist pattern 113a is protected by the photoresist pattern 113a located above to have approximately the same cross sectional area as the photoresist pattern 113a, thereby forming the spacer having a recessed side surface as shown in FIG. 8B.

Figure 8C:
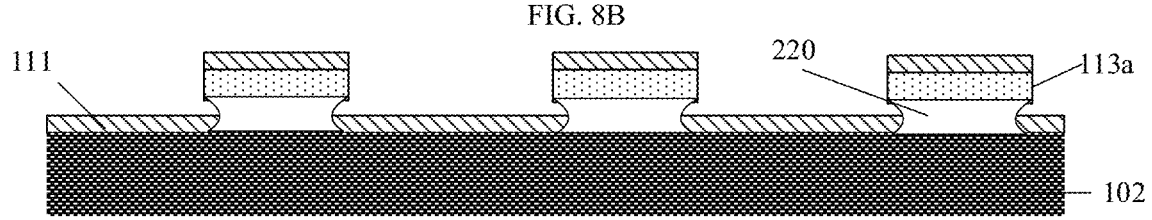
Figure 8D:
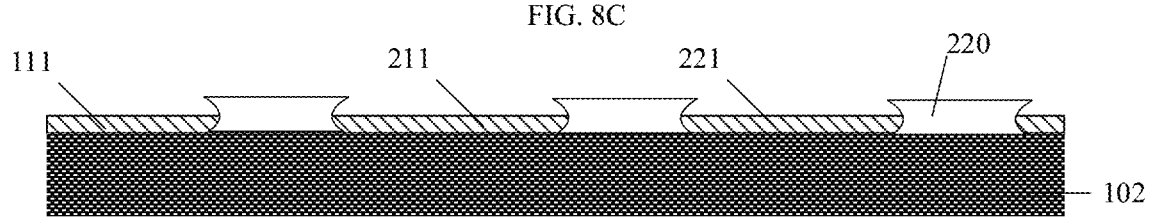

As shown in FIGS. 8C-8D, the first conductive layer 111 is formed at the photoresist pattern 113a, and the photoresist pattern 113a is then peeled off to form a first conductive pattern layer as shown in FIG. 8D, i.e., the first electrode 211 of the first light-emitting element and the second electrode 221 of the second light-emitting element. In this embodiment, the antireflection material layer 112 is multiplexed as the spacer 220. Therefore, no additional process and cost are required to form the spacer 220.

Figure 8E:
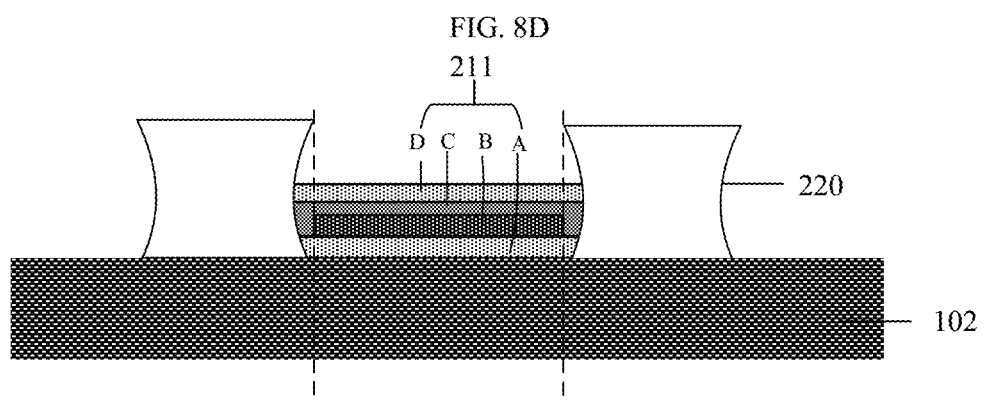

The first conductive layer 111 has a thickness less than the antireflection material layer 112. For example, the first conductive layer 111 includes a material with a high work function and high reflectivity to function as an anode, the material including a metal or a metal alloy, for example. FIG. 8E shows a schematic enlarged diagram of an example of the first electrode 211 of the first light-emitting element, and as shown, the first electrode 211 includes a Ti/Al/Ti/Mo (A/B/C/D) stacked structure in which metallic titanium (layers A and C) may serve as a buffer layer to improve adhesiveness between layers, aluminum (layer B) may serve as a high reflective material, and molybdenum (layer D) may serve as a material with a high work function to come into direct contact with an organic functional layer, thereby improving the carrier injection capability. In the stacked structure, the aluminum is completely enclosed by the titanium and molybdenum layers located above. Since aluminum has a lower work function and molybdenum and titanium have higher work functions, the aluminum is enclosed by the molybdenum and the titanium to avoid an influence on the carrier injection capability caused when the aluminum is exposed to come into direct contact with the organic functional layer at the first conductive layer 111.

The stacked structure may be formed with an electron beam evaporation technology, for example. For example, during the formation of the underlying titanium (layer A), a target material is placed eccentrically with respect to the substrate, such that the evaporated titanium material may reach the recessed side surface of the spacer 200 to form the titanium layer which is filled completely, which enhances adhesion of a surface of the substrate; when the aluminum layer is formed, a target material is centered with respect to the substrate, and since the spacer 220 which is formed previously has a wider top end, the aluminum is unable to completely cover the underneath titanium (in a range marked by a dotted line shown in FIG. 8E); during the subsequent formation of the titanium and molybdenum layers, target materials are placed eccentrically relative to the substrate respectively, thereby forming the titanium and molybdenum layers which are filled completely respectively to enclose the aluminum layer completely. As such, in the technology, the recessed side surface of the spacer 220 is utilized to form an efficient electrode material.

Figure 8F:
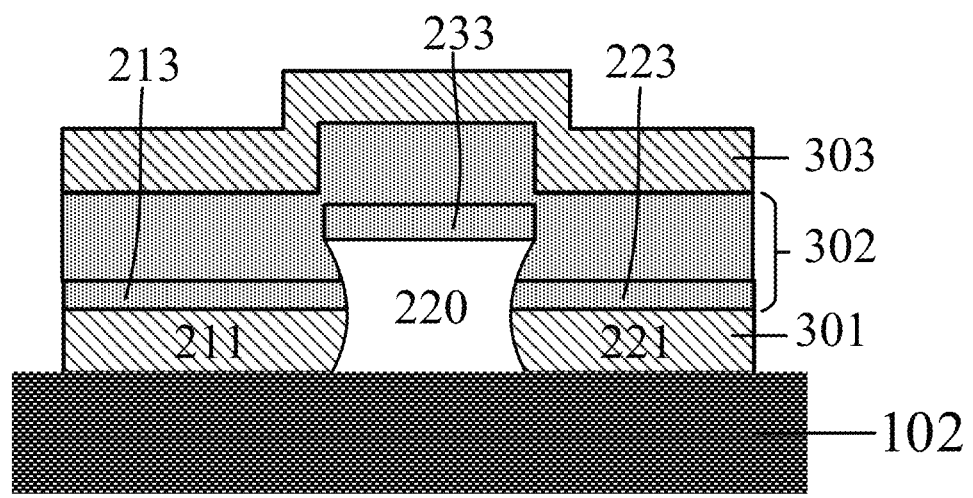

As shown in FIG. 8F, an organic functional material layer 114 is formed on a whole surface of the first conductive layer 111, for example, with an open mask in conjunction with an evaporation technology, and for example, the organic functional material layer 114 may include at least one light-emitting layer, at least one carrier injection layer, an electron/hole transport layer, an electron/hole barrier layer, a charge generation layer, or the like, as required, which are not repeated herein. Since the organic material has poor step coverage and has difficulty in attachment to a recessed surface of the spacer, the carrier injection layer is divided at the spacer 220, thereby forming the first carrier injection layer portion 213, the second carrier injection layer portion 223 and the third carrier injection layer portion 233 of the carrier injection layer which are spaced away from each other.

In the process, no additional patterning process is required to be performed on the organic functional material layer, and therefore, the resolution of the display device is not limited by accuracy of a mask plate; on the other hand, since the spacer 220 is formed before the organic functional material layer, the patterning process (for example, a photolithography technology) of forming the spacer 220 does not adversely affect a performance of the organic functional material layer.

The second conductive layer 303 is then formed at the organic functional material layer 114 to form the second electrode 212 of the first light-emitting element 201 and the second electrode 222 of the second light-emitting element 202, so as to form the first and second light-emitting elements 201, 202. For example, the second conductive layer 303 may be made of a transparent metal oxide conductive material, such as indium zinc oxide (IZO), indium tin oxide (ITO), indium gallium zinc oxide (IGZO), or the like, and may also be made of a transparent nano conductive material, such as a carbon nanotube, graphene, a nano silver wire, or the like.

FIGS. 9A-9E show flow charts of a manufacturing method of a pixel structure according to some other embodiments of the present disclosure. This embodiment is different from the above-mentioned embodiments mainly in a formation manner of the spacer.

Figure 9A:
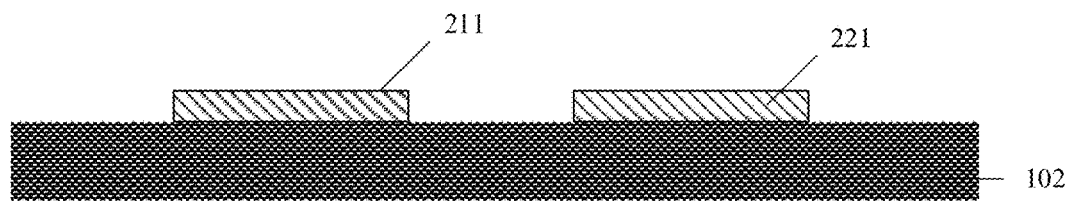
FIGS. 9A-9E are flow charts of a manufacturing method of a display substrate according to some other embodiments of the present disclosure.

As shown in FIG. 9A, a first conductive layer is formed on the driving substrate 102 and subjected to a patterning technology to form the first electrodes 211, 221 of the first and second light-emitting elements 201, 202 which are spaced apart.

The material and patterning technology of the first conductive layer may refer to the above-mentioned embodiments, and are not repeated herein.

Then, the spacer 220 is formed at a spaced position of the first electrodes 211, 221 of the first and second light-emitting elements 201, 202. In this embodiment, the spacer 220 is formed additionally, and therefore, selection of the material and the technology is flexible.

Figure 9B:
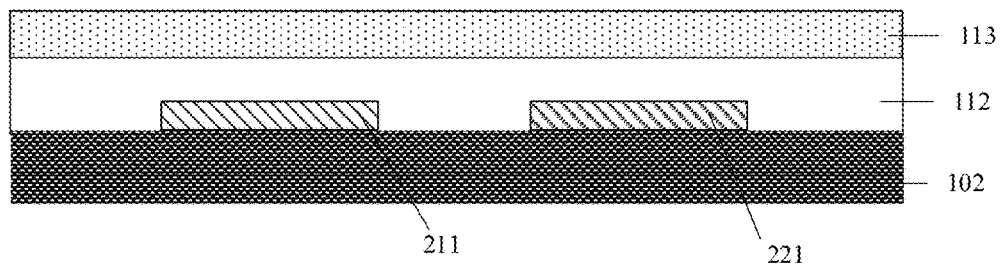
Figure 9C:
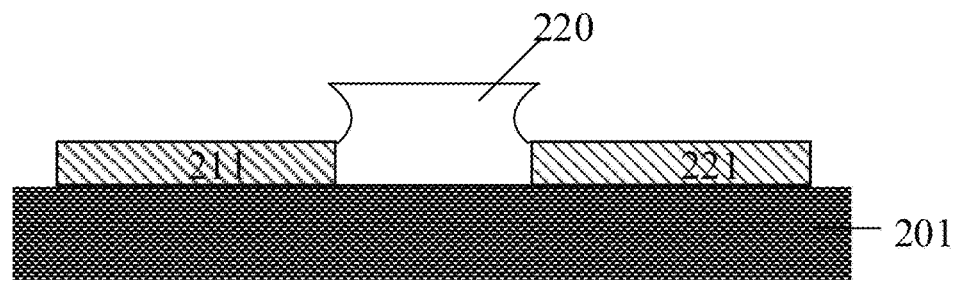

For example, as shown in FIG. 9B, an antireflection material layer 112 and a photoresist layer 113 are formed at the first conductive layer sequentially. The photoresist layer 113 is exposed and developed to obtain the spacer 220 as shown in FIG. 9C. The material and formation technology of the antireflection material layer may refer to the above-mentioned embodiments, and are not repeated herein.

Figure 9D:
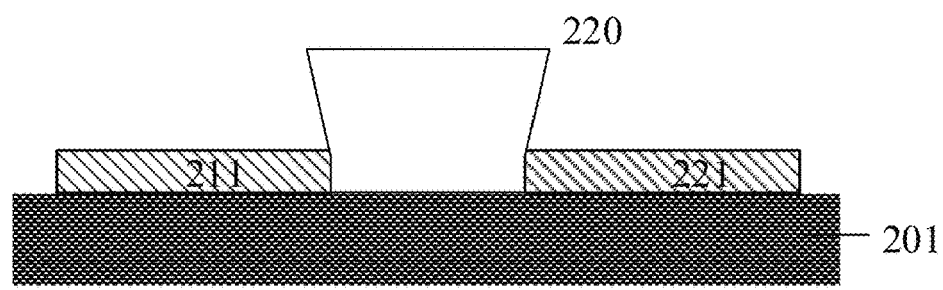

In some other embodiments, the spacer 220 may be made of a negative photoresist material. As shown in FIG. 9D, the spacer 220 has an inverted trapezoidal section. This is because negative photoresist has lower light sensitivity at a position closer to the substrate 20 in an exposure process, and thus, the spacer 200 having a small bottom area and a large top area may be obtained after development.

Figure 9E:
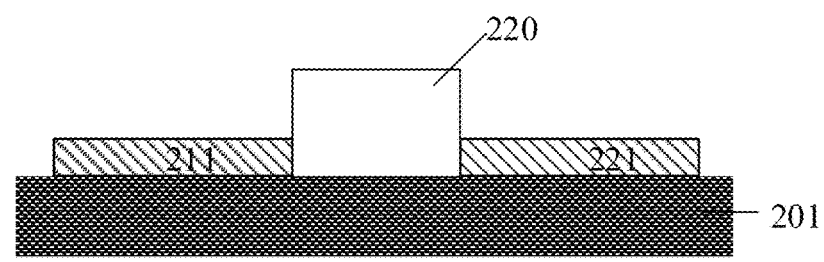

In further embodiments, the spacer 220 may be made of an inorganic insulating material in conjunction with a dry etching technology. For example, the spacer 220 may be made of a nitride, oxide or oxynitride of silicon. As shown in FIG. 9E, the spacer 220 has a rectangular section. This is because the dry etching technology has good anisotropy, and the lateral underetching phenomenon hardly occurs in an etching process, thereby obtaining a pattern having a section close to a rectangle.

Then, the organic functional material layers are formed with a whole surface on the spacer sequentially, for example, with the open mask in conjunction with the evaporation technology. Since the organic material has poor step coverage and has difficulty in attachment to the recessed surface of the spacer, the organic functional material layer is divided at the corresponding spacer 220 to form the organic functional layer of each light-emitting element.

Then, a second conductive layer, or the like, is formed at the organic functional material layer, which is not repeated herein.

In the manufacturing method, no additional patterning technology is required to be performed on the organic functional material layer, and therefore, the resolution of the display device is not limited by the accuracy of the mask plate; on the other hand, since the spacer 220 is formed before the organic functional material layer, the patterning technology (for example, a photolithography technology) of forming the spacer 220 does not adversely affect the performance of the organic functional material layer.

Figure 10:
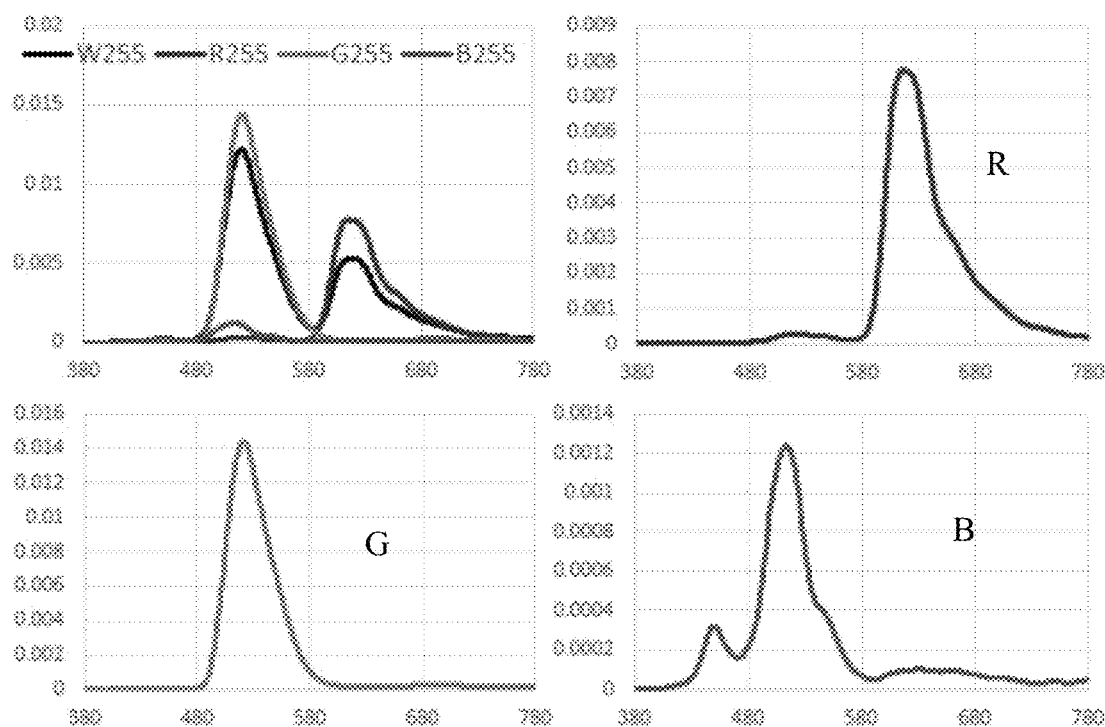
FIG. 10 is a spectrogram of the display substrate according to some embodiments of the present disclosure.

FIG. 10 shows a spectrogram of the display substrate according to at least one embodiment of the present disclosure, and shows a spectrogram when the red (R), green (G) and blue (B) sub-pixels are turned on simultaneously and spectrograms when the three types of sub-pixels are turned on respectively.

Referring to FIG. 1C, as shown in FIG. 10, when the three types of sub-pixels are turned on respectively, light of other colors is suppressed well, color coordinates of the three types of sub-pixels are improved greatly, and a display device formed by the display substrate may have a color gamut greater than 80%.

The above described are only exemplary implementations of the present disclosure, and not intended to limit the protection scope of the present disclosure. The scope of the present disclosure is defined by the appended claims.

What is claimed is:

1. A display substrate, having a first sub-pixel area and a second sub-pixel area which are adjacent,
wherein the display substrate comprises:
   a base substrate, and
   a first conductive layer, an organic functional layer and a second conductive layer which are on the base substrate sequentially,
      wherein the organic functional layer comprises a carrier injection layer;
      the first conductive layer comprises a first electrode and a second electrode, and the first electrode and the second electrode are in the first sub-pixel area and the second sub-pixel area, respectively, and are insulated from each other;
      the carrier injection layer comprises a first carrier injection layer portion and a second carrier injection layer portion, and the first carrier injection layer portion and the second carrier injection layer portion are in the first sub-pixel area and the second sub-pixel area, respectively;
      the second conductive layer comprises a third electrode and a fourth electrode, the third electrode and the fourth electrode are in the first sub-pixel area and the second sub-pixel areas, respectively, and the third electrode and the fourth electrode are connected with each other and are in an integrated structure;
      the first electrode, the first carrier injection layer portion and the third electrode form a first light-emitting element, and the second electrode, the second carrier injection layer portion and the fourth electrode form a second light-emitting element;
      the display substrate further comprises a spacer which is between the first and second light-emitting elements and separates the first carrier injection layer and the second carrier injection layer portion;
      the carrier injection layer further comprises a third carrier injection layer portion, and the third carrier injection layer portion is between the spacer and the second conductive layer, and is separated from the first carrier injection layer portion and the second carrier injection layer portion, respectively;
      the display substrate further comprises a drive circuit which is electrically connected with the first light-emitting element and the second light-emitting element, and the drive circuit is configured to drive the first light-emitting element and the second light-emitting element; the drive circuit comprises a transistor comprising a semiconductor layer which is inside the base substrate; and
      a ratio of a thickness of the second conductive layer to a thickness of the spacer ranges from 0.5 to 2 in a direction perpendicular to the base substrate.

2. The display substrate according to claim 1, wherein the carrier injection layer is configured as an electron injection layer or a hole injection layer.

3. The display substrate according to claim 1, wherein the spacer has a first recessed portion at a first side surface adjacent to the first carrier injection layer portion and a second recessed portion at a second side surface adjacent to the second carrier injection layer portion.

4. The display substrate according to claim 1, wherein the spacer has a width reduced first and then increased in a direction away from the base substrate.

5. The display substrate according to claim 1, wherein the spacer has an inverted trapezoidal section in a direction perpendicular to the base substrate.

6. The display substrate according to claim 1, wherein the spacer comprises an antireflection coating layer comprising an antireflection organic material; or
   the spacer is made of a negative photoresist material or an inorganic insulating material.

7. The display substrate according to claim 1, wherein the first light-emitting element and the second light-emitting element are configured to emit white light, respectively.

8. The display substrate according to claim 1, wherein the organic functional layer comprises a plurality of light-emitting layers stacked in a direction perpendicular to the base substrate.

9. The display substrate according to claim 8, further comprising a charge generation layer, wherein at least two of the plurality of light-emitting layers are connected with each other in series, and the charge generation layer is located between two adjacent light-emitting layers of the at least two light-emitting layers.

10. The display substrate according to claim 9, wherein the charge generation layer comprises a first charge generation layer portion and a second charge generation layer portion, and the first charge generation layer portion and the second charge generation layer portion are located in the first sub-pixel area and the second sub-pixel area respectively; and
the spacer also spaces the first charge generation layer portion away from the second charge generation layer portion.

11. The display substrate according to claim 9, wherein the plurality of light-emitting layers comprise a red-green light-emitting layer and a blue light-emitting layer which are connected with each other in series, and the charge generation layer is between the red-green light-emitting layer and the blue light-emitting layer.

12. The display substrate according to claim 11, wherein the red-green light-emitting layer comprises a red light-emitting layer and a green light-emitting layer which are adjacent to each other, and the red light-emitting layer is closer to the first conductive layer.

13. The display substrate according to claim 1, further comprising a third light-emitting element in a third sub-pixel area,
wherein the first light-emitting element, the second light-emitting element and the third light-emitting element form one pixel unit.

* * * * *

UNITED STATES PATENT AND TRADEMARK OFFICE
CERTIFICATE OF CORRECTION

| | | |
|---|---|---|
| PATENT NO. | : 11,539,017 B2 | Page 1 of 1 |
| APPLICATION NO. | : 16/960046 | |
| DATED | : December 27, 2022 | |
| INVENTOR(S) | : Shengji Yang et al. | |

It is certified that error appears in the above-identified patent and that said Letters Patent is hereby corrected as shown below:

On the Title Page

Item (71) Please amend Applicant:
From: BOE TECHNOLOGYGROUPCO., LTD, Beijing(CN)
To: BOE TECHNOLOGY GROUP CO., LTD., Beijing (CN)

Signed and Sealed this
Twenty-first Day of November, 2023

Katherine Kelly Vidal
*Director of the United States Patent and Trademark Office*